US 12,446,191 B2

(12) United States Patent
Li et al.

(10) Patent No.: US 12,446,191 B2
(45) Date of Patent: Oct. 14, 2025

(54) HEAT DISSIPATING DEVICE

(71) Applicant: PURPLE CLOUD DEVELOPMENT PTE. LTD., Singapore (SG)

(72) Inventors: Xiao-Yao Li, Hui Zhou (CN); Yu-Ka Feng, Hui Zhou (CN); Yuan-Long Wen, Hui Zhou (CN)

(73) Assignee: PURPLE CLOUD DEVELOPMENT PTE. LTD., Singapore (SG)

( * ) Notice: Subject to any disclaimer, the term of this patent is extended or adjusted under 35 U.S.C. 154(b) by 247 days.

(21) Appl. No.: 17/975,510

(22) Filed: Oct. 27, 2022

(65) Prior Publication Data

US 2024/0049429 A1 Feb. 8, 2024

(30) Foreign Application Priority Data

Aug. 2, 2022 (CN) .......................... 202210922660.X

(51) Int. Cl.
*H05K 7/20* (2006.01)
*F28D 15/02* (2006.01)
*H01L 23/427* (2006.01)

(52) U.S. Cl.
CPC ..... *H05K 7/20327* (2013.01); *F28D 15/0266* (2013.01); *H01L 23/427* (2013.01); *H05K 7/20309* (2013.01); *H05K 7/2039* (2013.01); *F28F 2215/06* (2013.01)

(58) Field of Classification Search
CPC ............... F28D 15/0266; F28D 15/025; F28D 15/0225; F28D 15/02; F28D 15/0275; F28D 15/043; H05K 7/20336; H05K 7/20327; H05K 7/2029; H05K 7/20318; H05K 7/20309; H05K 7/20663; H05K 7/20672;
(Continued)

(56) References Cited

U.S. PATENT DOCUMENTS 6,966,362 B2 * 11/2005 Tanaka .................. F28F 9/0221
165/104.21
7,515,416 B2 * 4/2009 McBain ............. H05K 7/20254
174/15.1
(Continued)

FOREIGN PATENT DOCUMENTS

CN 113251837 8/2021
CN 113710056 11/2021
(Continued)

*Primary Examiner* — Jianying C Atkisson
*Assistant Examiner* — For K Ling
(74) *Attorney, Agent, or Firm* — Merchant & Gould P.C.

(57) ABSTRACT

A heat dissipating device has a thermal board, at least one cooling fin, and a working fluid. The thermal board has at least one chamber and a passive one-way valve section. Each of the at least one chamber has a first inlet and at least one first outlet. Each of the at least one cooling fin has an inner space, at least one second inlet, and a second outlet. The second inlet is connected to the first outlet. The second outlet is connected to the first inlet. The working fluid is filled in the chamber and the inner space. The passive one-way valve section is configured to limit the working fluid to cycle in the chamber and the inner space along a single direction. The heat dissipating device facilitates the cycling capability of two phases flow coolant and provides a heat dissipating capability.

16 Claims, 14 Drawing Sheets

(58) Field of Classification Search
CPC . H05K 7/20681; H01L 23/427; H01L 23/473; F28F 2215/06
See application file for complete search history.

(56) References Cited

U.S. PATENT DOCUMENTS

| | | | | |
|---|---|---|---|---|
| 2006/0266496 | A1* | 11/2006 | Edward | H01L 23/3677 |
| | | | | 257/E23.113 |
| 2013/0077245 | A1 | 3/2013 | Gradinger et al. | |
| 2013/0340978 | A1* | 12/2013 | Agostini | H05K 7/20309 |
| | | | | 165/104.21 |
| 2014/0352927 | A1* | 12/2014 | Agostini | F28D 15/0266 |
| | | | | 165/104.21 |
| 2017/0003083 | A1* | 1/2017 | Manninen | H05K 7/20327 |
| 2019/0274230 | A1* | 9/2019 | North | H05K 7/20309 |
| 2020/0011610 | A1 | 1/2020 | Wang et al. | |
| 2021/0318071 | A1* | 10/2021 | Hart | F28D 1/0316 |
| 2023/0098311 | A1* | 3/2023 | Chen | F28D 15/043 |
| | | | | 165/104.26 |

FOREIGN PATENT DOCUMENTS

| | | | | |
|---|---|---|---|---|
| CN | 113710056 A | * | 11/2021 | ......... H05K 7/20327 |
| CN | 114485238 | | 5/2022 | |
| CN | 114630560 | | 6/2022 | |
| JP | 2002261217 A | * | 9/2002 | ......... F28D 15/0233 |

* cited by examiner

HEAT DISSIPATING DEVICE

BACKGROUND OF THE INVENTION

1. Field of the Invention

The present invention relates to a heat dissipating device, especially to a heat dissipating device that has a passive one-way valve structure.

2. Description of the Prior Arts

With the development of technology, the working efficiency of the electronic components is further improved, but the heat generated by the electronic components also increases. In order to dissipate the heat generated by the electronic components, a heat dissipating device is often used, and a thermal board of the heat dissipating device is used to contact the electronic components. The thermal board has a cycling channel filled with coolant. When the thermal board contacts the heating source of the electronic components, the coolant in the cycling channel absorbs the heat generated by the electronic components to cool down the electronic components.

A conventional heat dissipating device is a two phases flow heat dissipating device, such as a heat pipe, a roll-bond evaporator, or a vapor chamber. When in use, if the level of the condensing end of the heat dissipating device is lower than the level of the evaporating end, the water return capacity will be deteriorated due to the gravity, and might even make the coolant in the cycling channel unable to return, which leads to dry-burning phenomenon on the evaporating section, thereby failing to effectively cool down the electronic components. This is the shortcoming of the conventional cooling device and the problem to be solved.

To overcome the shortcomings, the present invention provides a heat dissipating device to mitigate or obviate the aforementioned problems.

SUMMARY OF THE INVENTION

The main objective of the present invention is to provide a heat dissipating device that restricts the coolant to flow in a single direction to ensure the returning capability of the coolant no matter where the heat dissipating device is installed, thereby enhancing the cycling capability of the two phases flow coolant and providing a heat dissipating capability.

The heat dissipating device has a thermal board, at least one cooling fin, and a working fluid. The thermal board has at least one chamber, a first evaporating section, a second evaporating section, and a passive one-way valve section. Each of the at least one chamber has a first inlet and at least one first outlet. The first inlet is connected to an end of said chamber. Each of the at least one first outlet is connected to another end of said chamber. The first evaporating section is adjacent to the first inlet. The second evaporating section is adjacent to the at least one first outlet. The passive one-way valve section is located between the first evaporating section and the second evaporating section. The first evaporating section, the passive one-way valve section, and the second evaporating section sequentially connected to each other. Each of the at least one cooling fin has an inner space, at least one second inlet, and a second outlet. The at least one second inlet and the second outlet are formed by the inner space. The at least one second inlet is connected to the at least one first outlet. The second outlet is connected to the first inlet. The working fluid is filled in the at least one chamber and the inner space. The passive one-way valve section is configured to limit the working fluid to cycle in the at least one chamber of the thermal board and the inner space of the at least one cooling fin along a single direction.

By forming the first evaporating section, the passive one-way valve section, and the second evaporating section in the chamber of the thermal board, and making the passive one-way valve section a tesla valve structure, after the working fluid in the thermal board is heated and evaporated by the heating source, the working fluid is restricted to sequentially flow through the first evaporating section, the passive one-way valve section, and the second evaporating section, and then flows into the cooling fin along a single direction, and eventually flows back to the first evaporating section of the thermal board after condensation. In this way, the evaporation and condensation cycle of the working fluid is implemented to improve the heat dissipating effect. Further, the heat dissipating device can therefore be installed in different positions, in different directions, and at different angles, thereby having a high flexibility and a wide range of use.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
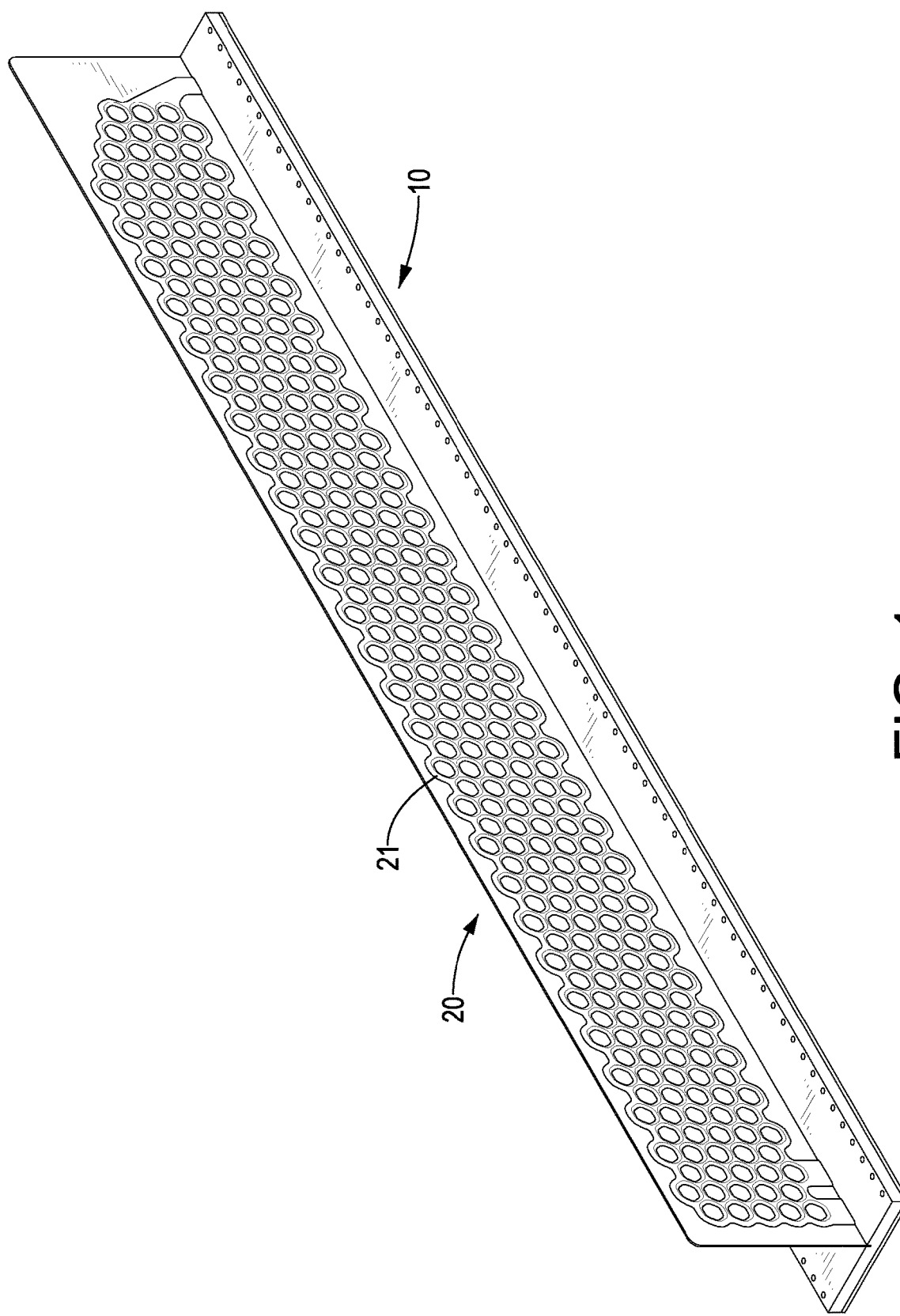
FIG. 1 is a perspective view of a first embodiment of a heat dissipating device in accordance with the present invention.
Figure 2:
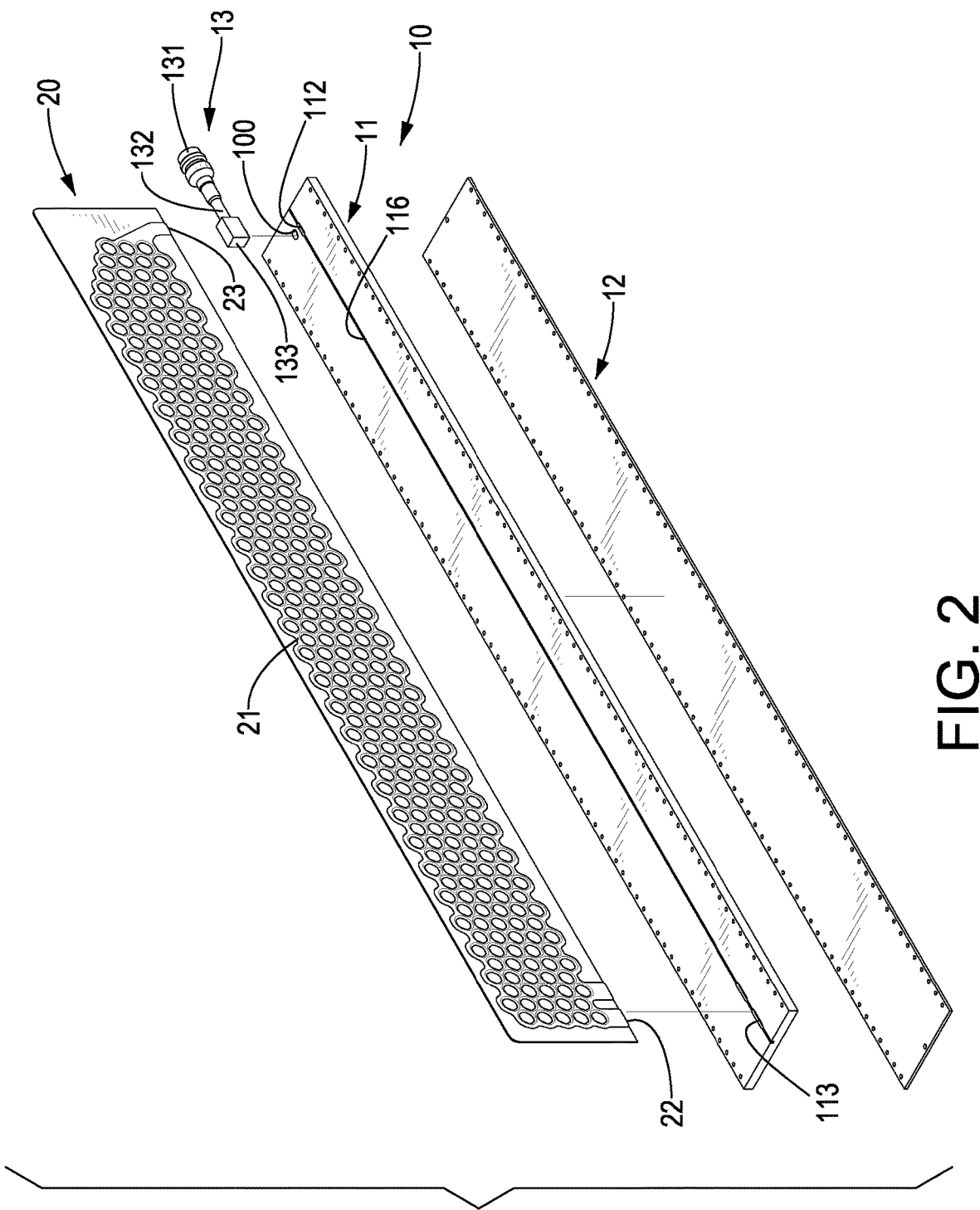
FIG. 2 is an exploded view of the first embodiment of the heat dissipating device in FIG. 1.
Figure 3:
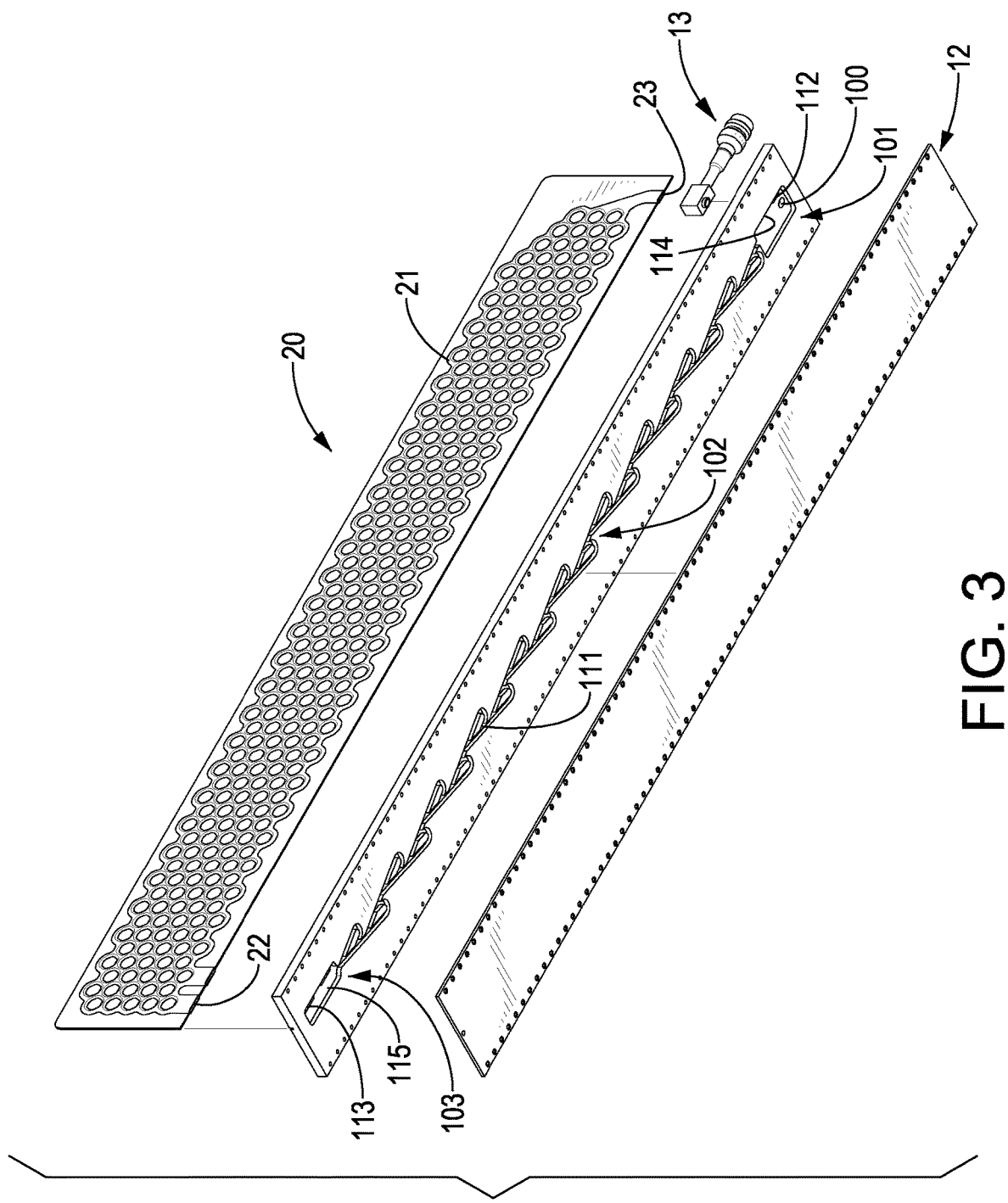
FIG. 3 is another exploded view of the first embodiment of the heat dissipating device in FIG. 1, viewed from another angle.
Figure 4:
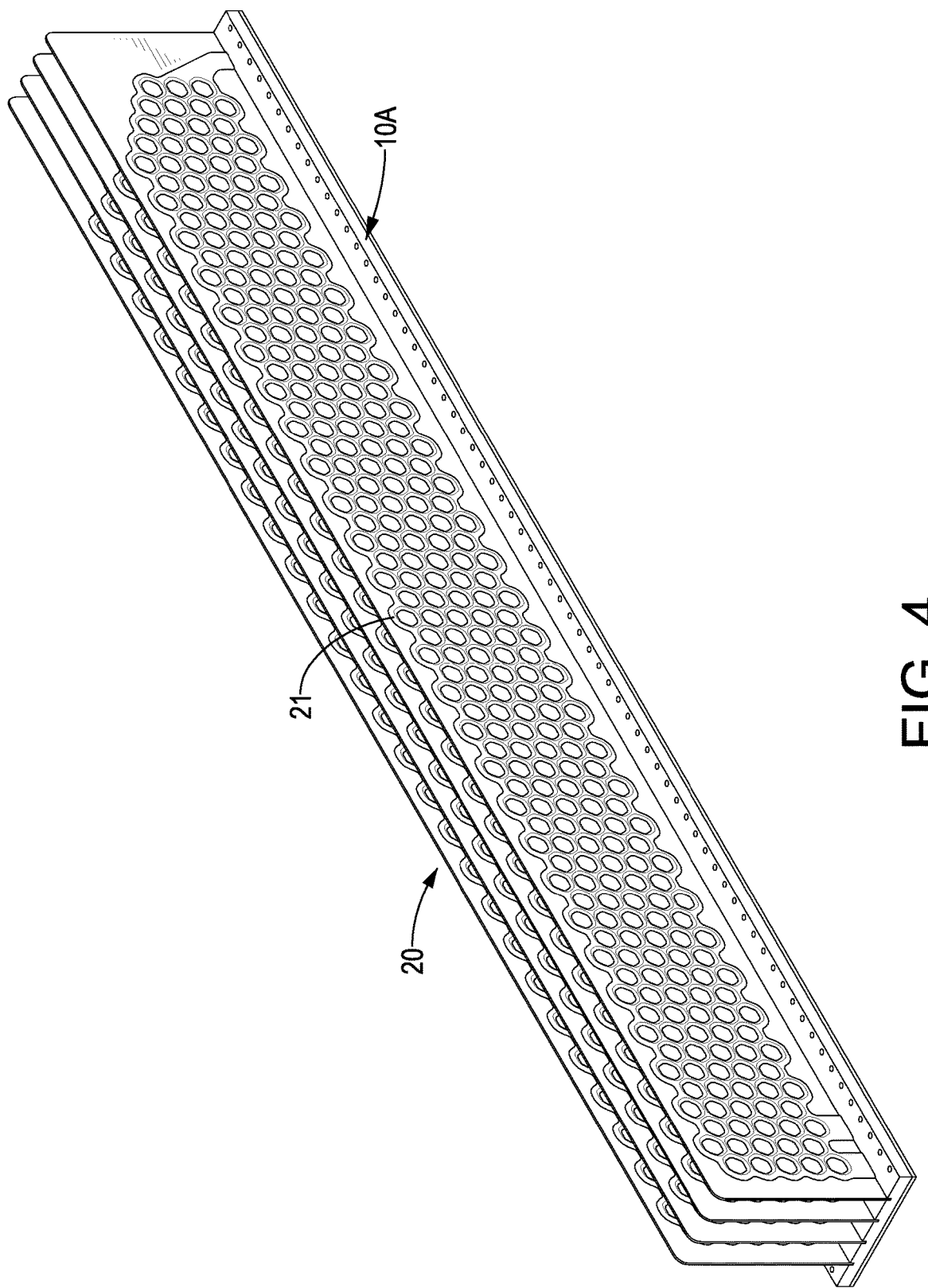
FIG. 4 is a perspective view of a second embodiment of the heat dissipating device in accordance with the present invention.
Figure 5:
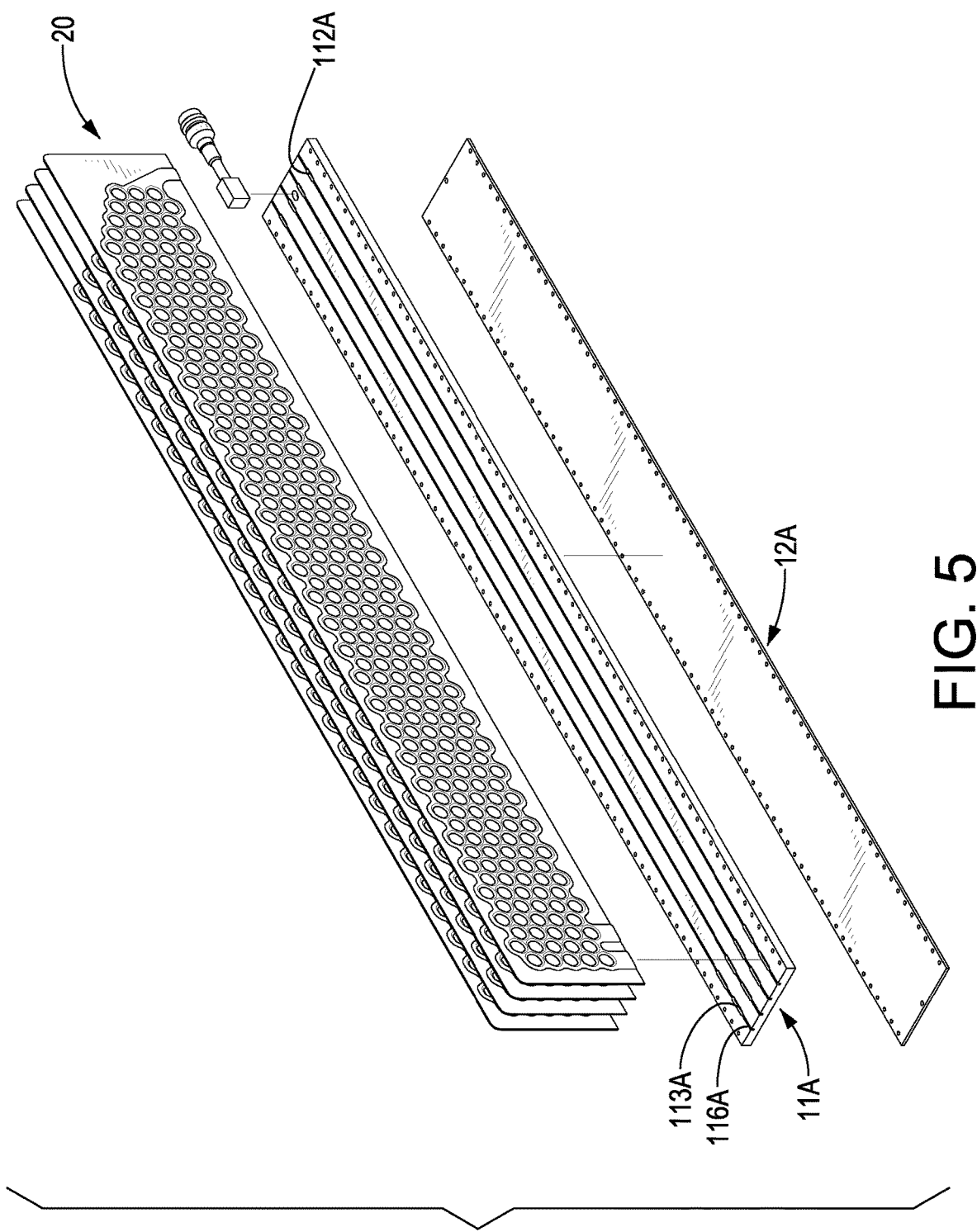
FIG. 5 is an exploded view of the second embodiment of the heat dissipating device in FIG. 4.
Figure 6:
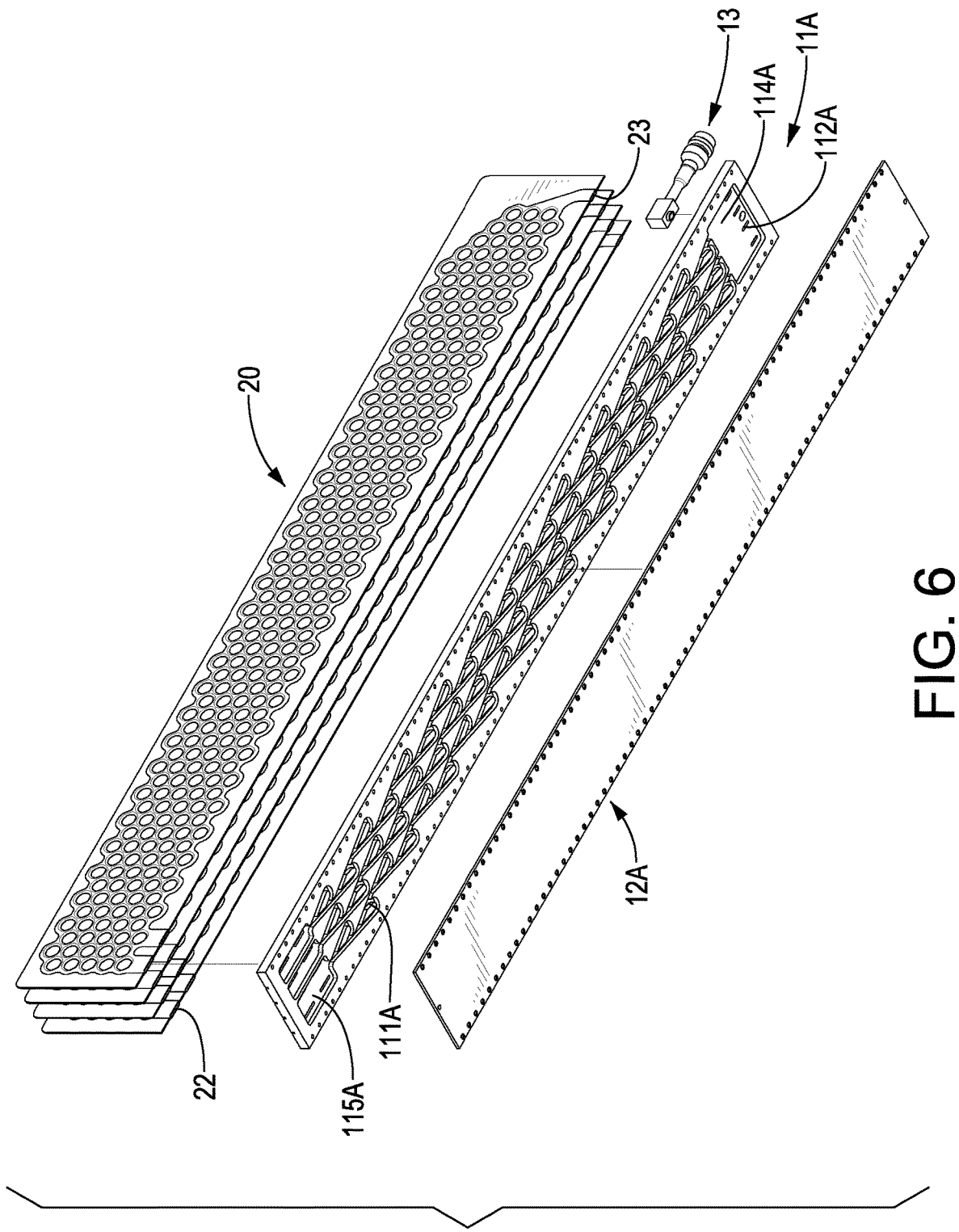
FIG. 6 is another exploded view of the second embodiment of the heat dissipating device in FIG. 4, viewed from another angle.
Figure 7:
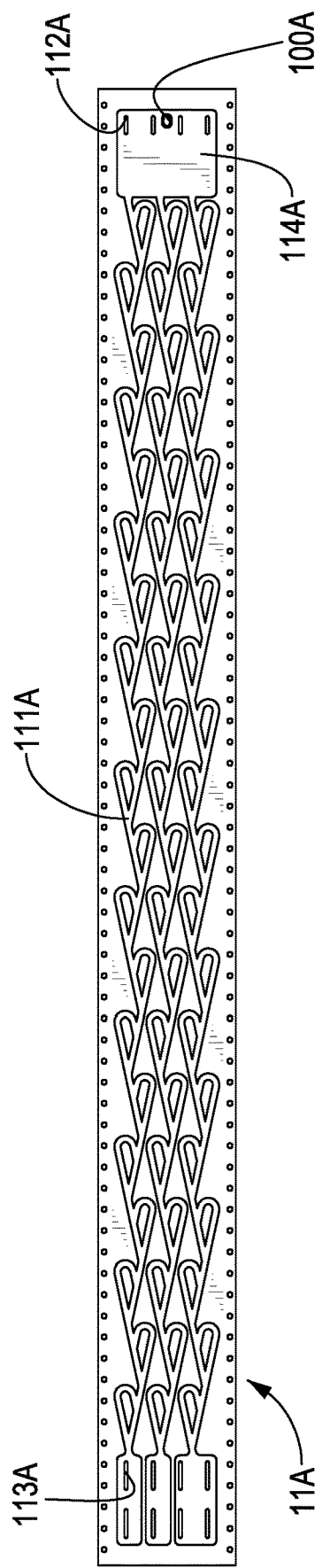
FIG. 7 is a side view of the second embodiment of the heat dissipating device in FIG. 4, showing the main body.
Figure 9:
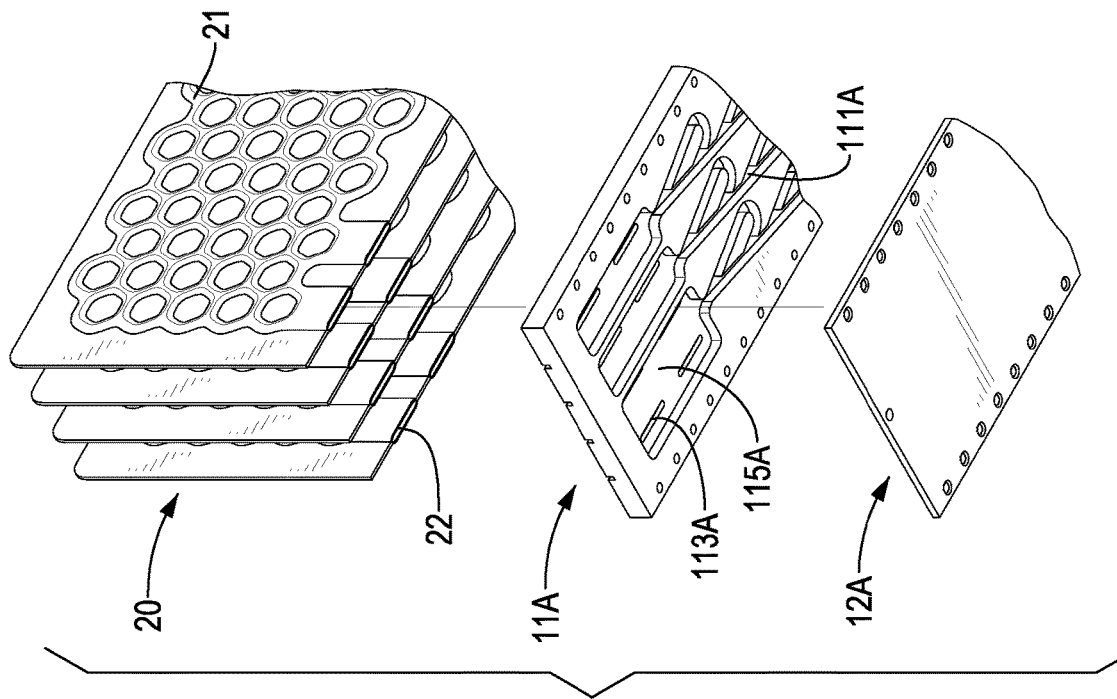
FIG. 9 is another partial enlarged exploded view of the second embodiment of the heat dissipating device in FIG. 4, showing the portion of the structures from another angle.
Figure 8:
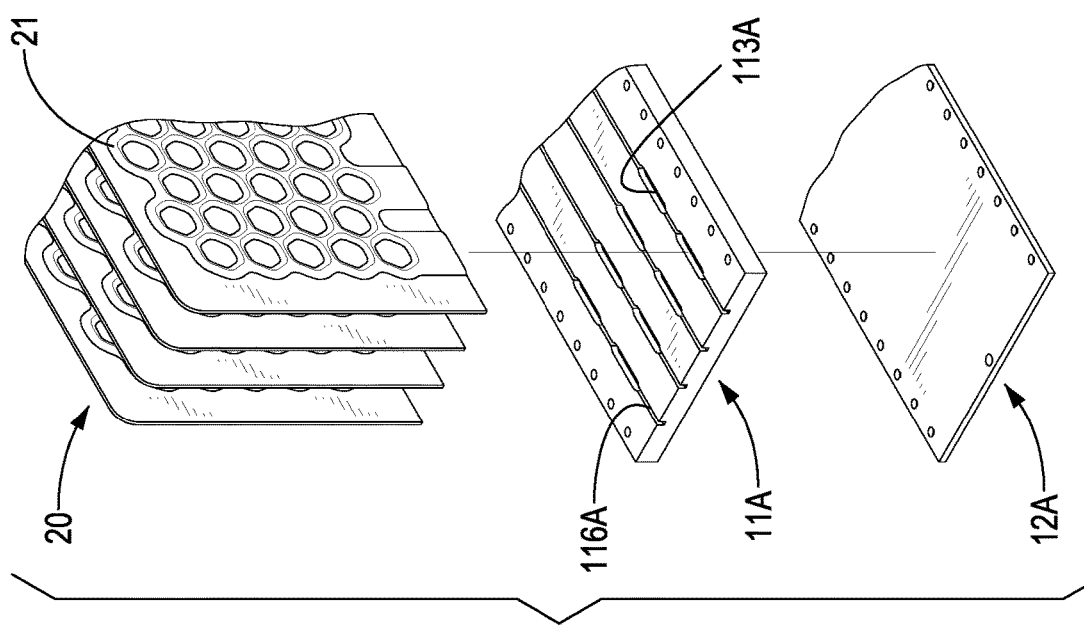
FIG. 8 is a partial enlarged exploded view of the second embodiment of the heat dissipating device in FIG. 4, showing a portion of the structures.
Figure 11:
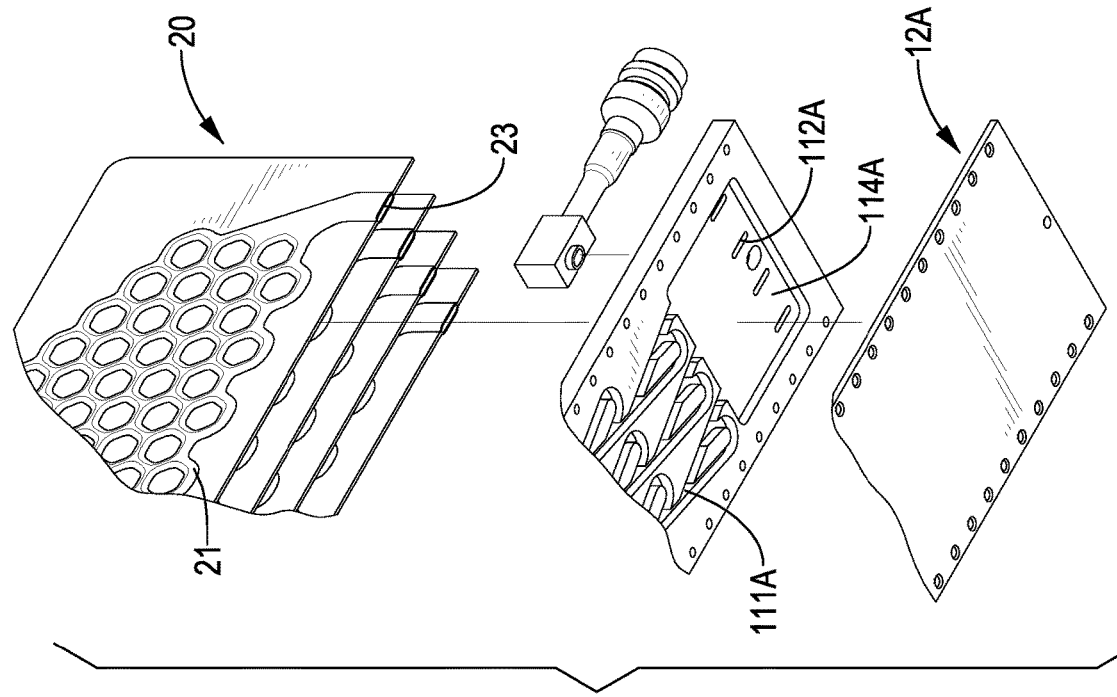
FIG. 11 is still another partial enlarged exploded view of the second embodiment of the heat dissipating device in FIG. 4, showing a portion of the structures with the liquid filling unit from another angle.
Figure 10:
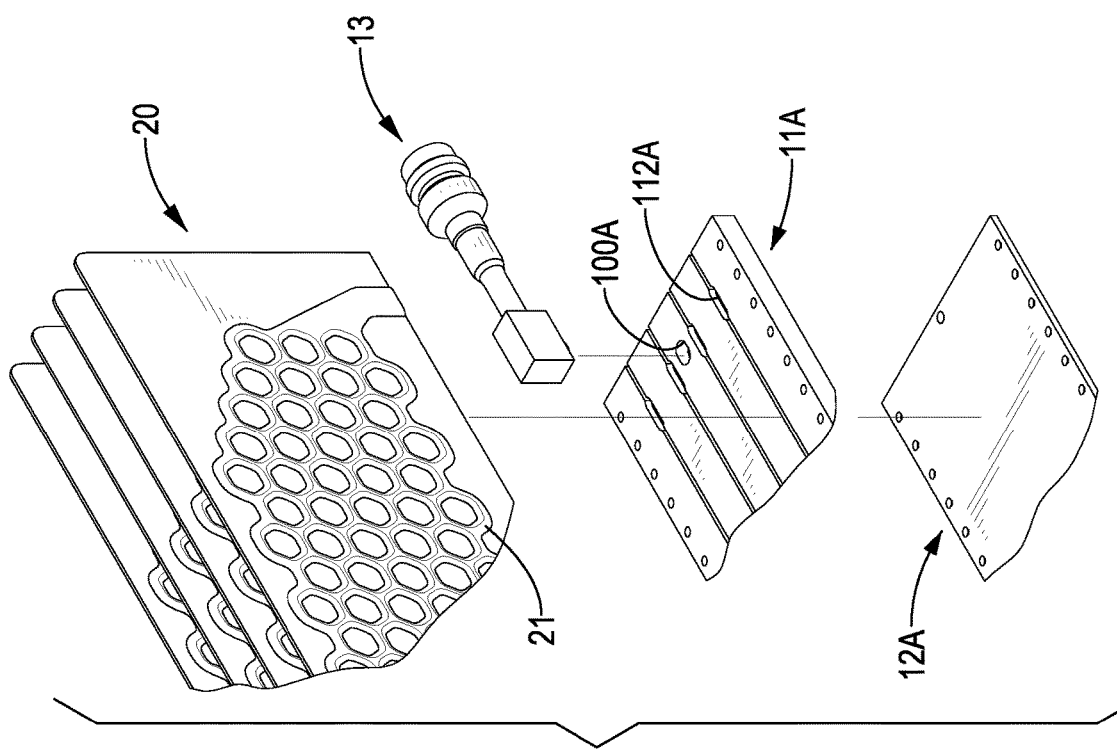
FIG. 10 is still another partial enlarged exploded view of the second embodiment of the heat dissipating device in FIG. 4, showing a portion of the structures with the liquid filling unit.
Figure 12:
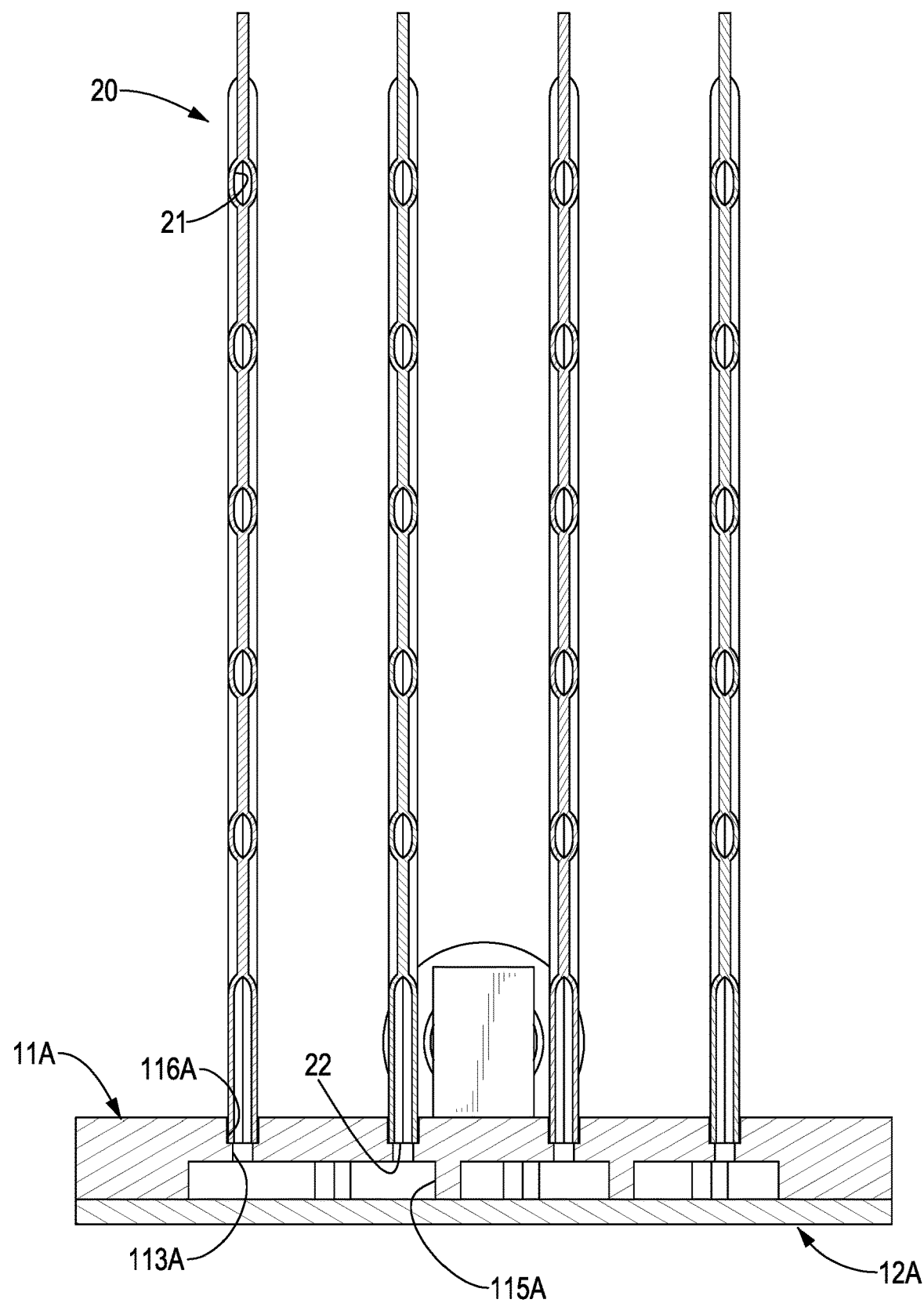
FIG. 12 is an end view in cross-section of the second embodiment of the heat dissipating device in FIG. 4.

With reference to FIGS. 1 to 3, a first embodiment of a heat dissipating device in accordance with the present invention comprises a thermal board 10 and at least one cooling fin 20.

The thermal board 10 can be a board and has at least one chamber 111 formed inside. Corresponding to each of the at least one chamber 111, the thermal board 10 has a first inlet 112 and at least one first outlet 113. The first inlet 112 is connected to an end of the corresponding chamber 11. Each of the at least one first outlet 113 is connected to another end of the corresponding chamber 11. As an embodiment shown in the drawings, a number of the at least one first outlet 113 can be two, but it is not limited thereto as the number of the at least one first outlet 113 can be arranged as needed.

The thermal board 10 sequentially forms a first evaporating section 101, a passive one-way valve section 102, and a second evaporating section 103. The first evaporating section 101 is adjacent to the first inlet 112. The second evaporating section 103 is adjacent to the at least one first outlet 113. The passive one-way valve section 102 is located between the first evaporating section 101 and the second evaporating section 103.

Specifically, the thermal board 10 has a main body 11 and a cover 12. An assembling groove 116 is formed inward on a first side surface of the main body 11. The assembling groove 116 is elongated. A second side surface of the main body 11 is assembled with the cover 12. The chamber 111 is formed on the second side surface of the main body 11. An inlet recess 114 and an outlet recess 115 are formed inward on the second side surface of the main body 11. The inlet recess 114 and the outlet recess 115 are respectively located in two ends of the chamber 11 and are connected to each other. The inlet recess 114 is connected to the first inlet 112. The outlet recess 115 is connected to each of the at least one first outlet 113.

With reference to FIGS. 1 to 3, a number of the first inlet 112 of the main body 11 of the thermal board 10 is one, and the first inlet 112 is connected to the inlet recess 114. A number of the at least one first outlet 113 is two, and the two first outlets 113 are connected to the outlet recess 115. But the configuration above is not limited thereto.

The passive one-way valve section 102 of the chamber 111 of the main body 11 is a tesla valve. The tesla valve is a conventional structure that can limit fluids to flow in only one direction, and will not be detailed below.

The main body 11 has a filling port 100 adjacent to the first evaporating section 101 and connected to the inlet recess 114, but the configuration of the filling port 100 is not limited thereto, as the filling port 100 can be disposed on any position in the passive one-way valve section 102 or the second evaporating section 103 of the chamber 111. The heat dissipating device has a liquid filling unit 13. An end of the liquid filling unit 13 is connected to the filling port 100. The liquid filling unit 13 has a channel formed inside, and a preferred embodiment the liquid filling unit 13 has a liquid filling connector 131, a connecting pipe 132, and a fixing base 133. An end of the connecting pipe 132 is the liquid filling connector 131, and another end of the connecting pipe 132 is the fixing base 133. The fixing base 133 has a protrusion, and the protrusion is connected to the filling port 100 to connect the channel inside the liquid filling unit 13 and the filling port 100. The liquid filling unit 13 and the main body 11 are conventional components, and will not be detailed below.

Each of the at least one cooling fin 20 has an inner space formed inside, and the inner space forms an extending channel 21. An end of the extending channel 21 has at least one second inlet 22, and another end of the extending channel 21 has a second outlet 23. The at least one second inlet 22 is connected to the at least one first outlet 113. The second outlet 23 is connected to the first inlet 112. As an embodiment shown in the drawings, a number of the at least one second inlet 22 can be two, but it is not limited thereto, as the amount of the at least one second inlet 22 can be arranged as needed.

The at least one cooling fin 20 is made by blow molding, which forms multiple geometric working chambers on a sheet. Each of the working chambers has multiple extending channels 21 connected to each other. Each of the working chambers and each of the extending channels 21 can be implemented in any geometric shape, such as hexagon, circle, rhombus, etc.

An end of the cooling fin 20 is assembled with the assembling groove 116 of the main body 11 of the thermal board 10. The first inlet 112 is connected to the second outlet 23. The first outlet 113 is connected to the second inlet 22. After the chamber 11 of the thermal board 10 and the extending channel 21 of the cooling fin 20 are vacuumed, a working fluid is filled into the chamber and the extending channel 21 through the liquid filling connector 131, the connecting pipe 132, and the fixing base 133 of the liquid filling unit 13. After the filling process of the working fluid is accomplished, the filling port 100 is sealed. The working fluid can be implemented as refrigerant.

When in use, the working fluid in the chamber 111 of the thermal board 10 is heated by a heat source and therefore evaporates into gas. The gas working fluid flows in a single direction sequentially through the first evaporating section 101, the passive one-way valve section 102, and the second evaporating section 103 by the work of pressure. Then, the working fluid flows out from each of the at least one first outlet 113 and flows into the extending channel 21 of the cooling fin 20 via the second inlet 22. Then, the working fluid flows into the first inlet 112 via the second outlet 23 to return to the first evaporating section 101. After then, the working fluid is heated again by the heat source and performs the aforementioned cycling to dissipate the heat of the heat source.

The heat dissipating device in the present invention uses the tesla valve structure chamber of the thermal board to restrict the flowing direction of the working fluid to one way, such that after the working fluid evaporates and is under the work of pressure, the working fluid flows along only one direction, thereby effectively overcoming the influence of gravity, realizing the working characteristics of "360-degree anti-gravity use" to allow the heat dissipating device to be installed and correctly work in any position and any direction, and enhancing the cycling capability and the heat dissipating capacity of the two phases flow coolant.

With reference to FIGS. 4 to 7, in a second embodiment of the heat dissipating device of the present invention, the heat dissipating device has a thermal board 10A and four cooling fins 20. Each of the four cooling fins 20 is the same as in the first embodiment, and the differences between the second embodiment and the first embodiment are in the thermal board 10A. Specifically, the thermal board 10A has four assembling grooves 116A formed on a side surface of the main body 11A, and has three chambers 111A, one inlet recess 114A, and three outlet recesses 115A formed on another side surface of the main body 11A. The three chambers 111A are arranged side by side in the main body 11A. An end of each of the three chambers 111A is connected to the inlet recess 114A, and another end of each of the three chambers 111A, i.e., three ends are respectively connected to the three outlet recesses 115A. The main body 11A has four first inlets 112A connected to the inlet recess 114A. Two first outlets 113A are formed on each of the three outlet recesses 115A.

With reference to FIGS. 8 to 12, in the second embodiment, the four cooling fins 20 are respectively assembled with the four assembling grooves 116A, and each of the four cooling fins 20 is mounted in the corresponding assembling groove 116A with an end having the second inlet 22 and the second outlet 23. The second inlet 22A is connected to the corresponding first outlet 113A and the outlet recess 115A. The second outlet 23 is connected to the corresponding first inlet 112A and the inlet recess 114A. The cover 12A is mounted on and seals the side surface of the main body 11A having the chamber 111A.

When the second embodiment is in use, the working fluid in each of the chambers 111A of the thermal board 10A is heated by the heat source and therefore evaporates into gas. The gas working fluid flows in a single direction sequentially through the first evaporating section 101, the passive one-way valve section 102, and the second evaporating section 103 by the work of pressure. Then, the working fluid flows out from each of the at least one first outlet 113A and flows into the extending channel 21 of the at least one cooling fin 20 via the second inlet 22. Then, the working fluid flows into the first inlet 112A via the second outlet 23 to return to the first evaporating section 101. After then, the working fluid is heated again by the heat source and performs the aforementioned cycling to dissipate the heat of the heat source.

Figure 13:
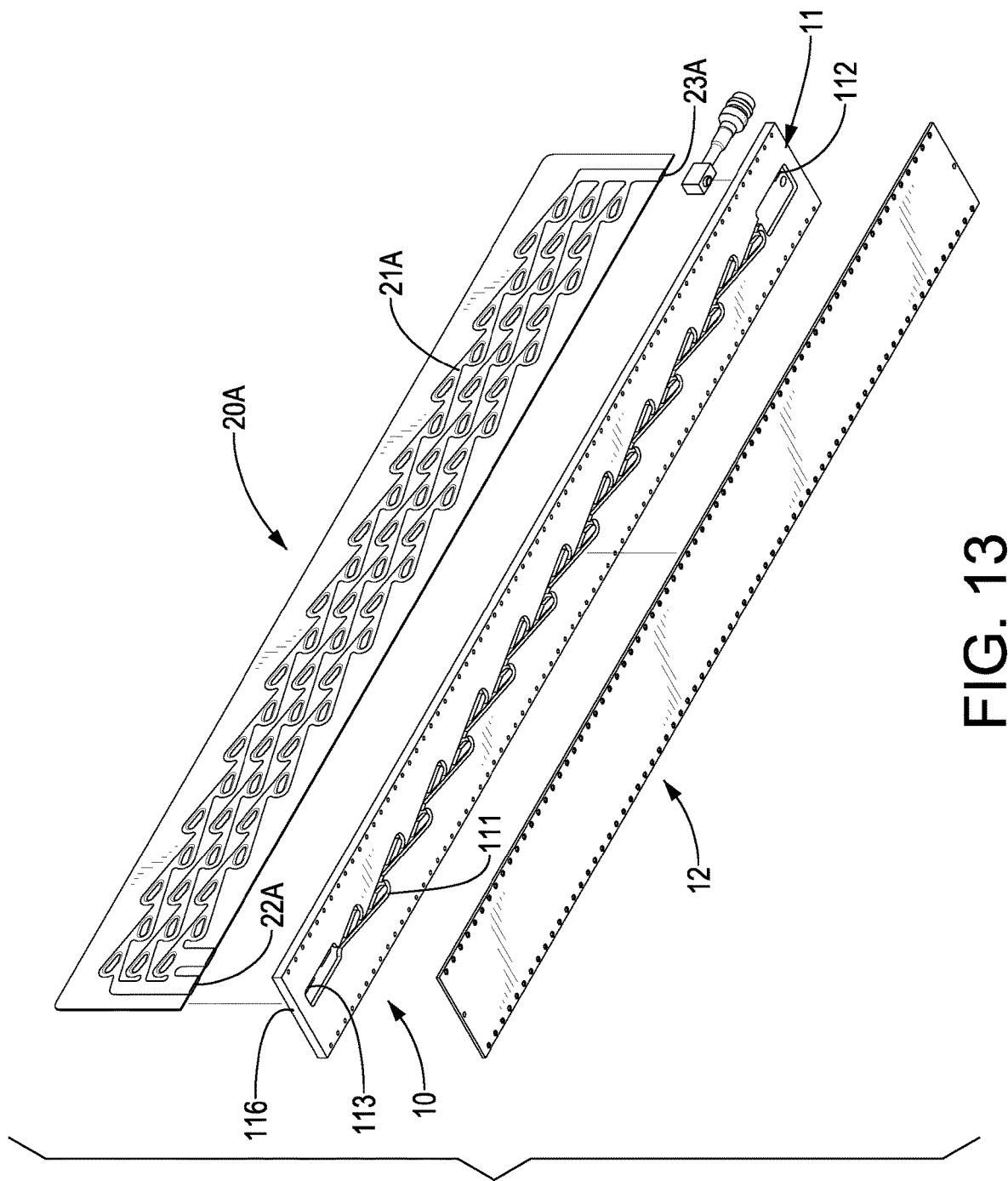
FIG. 13 is an exploded view of a third embodiment of the heat dissipating device in accordance with the present invention.

With reference to FIG. 13, in a third embodiment of the heat dissipating device in the present invention, the heat dissipating device has a thermal board 10 and a cooling fin 20A. The thermal board 10 is the same as in the first embodiment, and the differences between the third embodiment and the first embodiment are in the cooling fin 20A. Specifically, the inner space of the cooling fin 20A forms at least one cooling fin chamber 21A, which is the same in structure as the chamber 111 of the main body 11 in the first embodiment. As the embodiment shown in the drawings, the cooling fin 20A has three cooling fin chambers 21A. Each of the three cooling fin chambers 21A has a channel. Ends of the three channels are connected to one another and are connected to the second outlet 23A. Opposite ends of the three channels are connected and are connected to the two second inlets 22A. When in use, the cooling fin 20A is installed in the assembling groove 116 of the main body 10. The second outlet 23A is connected to the first inlet 112. The two second inlets 22A are connected to the two first outlets 113.

In the third embodiment, the tesla valve structure of the cooling fin chamber 21A of the cooling fin 20A works with the tesla valve structure of the chamber 111 of the main body 11 of the thermal board 10 to make the working fluid flow in a single direction.

Figure 14:
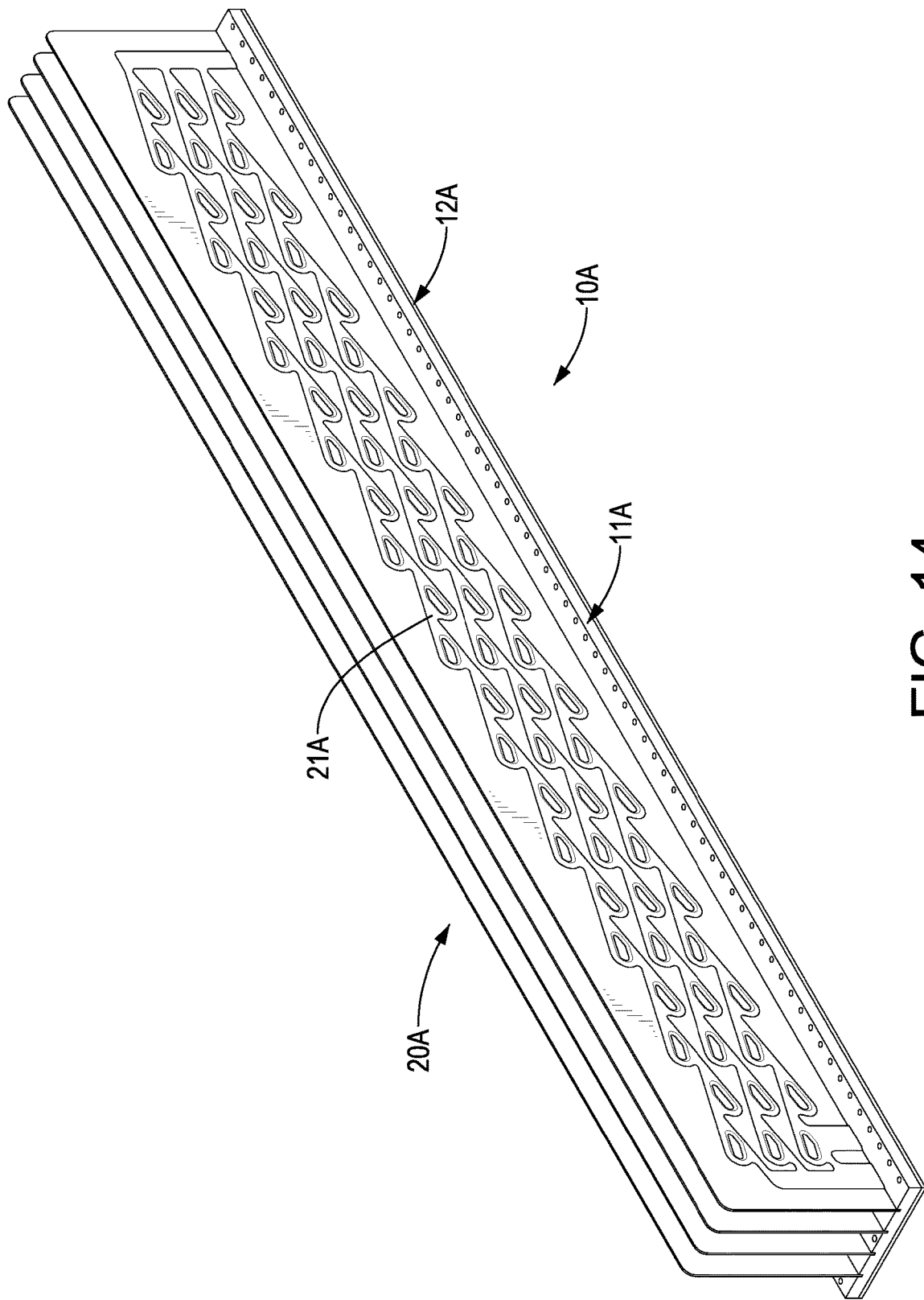
FIG. 14 is a perspective view of a fourth embodiment of the heat dissipating device in accordance with the present invention.
Figure 15:
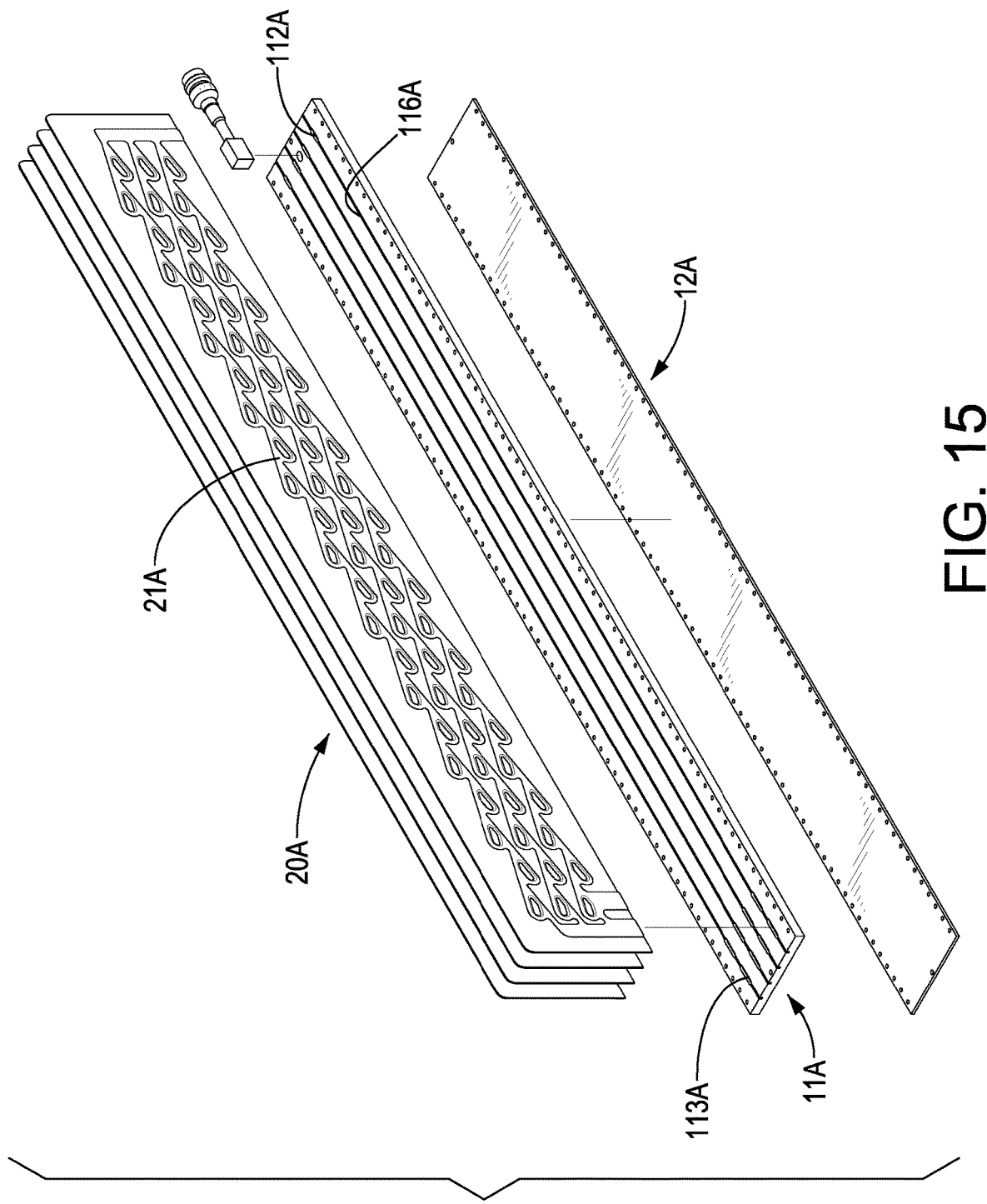
FIG. 15 is an exploded view of the fourth embodiment of the heat dissipating device in FIGS. 14.
Figure 16:
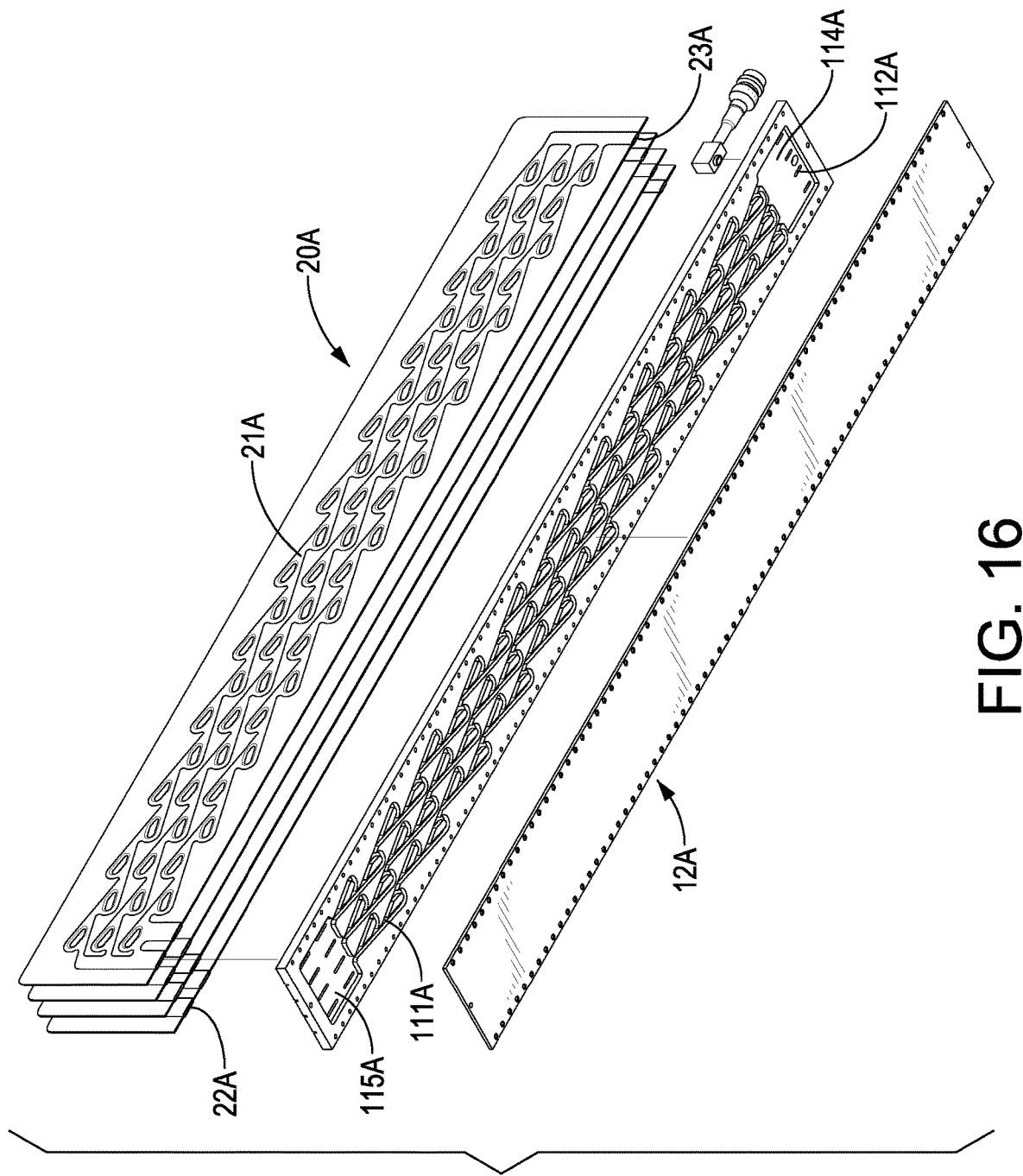
FIG. 16 is another exploded view of the fourth embodiment of the heat dissipating device in FIG. 14, shown from another angle.

With reference to FIGS. 14 to 16, in a fourth embodiment, the heat dissipating device has a thermal board 10A and four cooling fins 20A. The thermal board 10A is the same as in the second embodiment. Each of the four cooling fins 20A is the same as in the third embodiment. Since the thermal board 10A and the cooling fin 20A are instructed above, the structures are not detailed below.

When assembled, each of the four cooling fins 20A is mounted in the corresponding assembling groove 116A of the main body 11A. The second outlet 23A of each of the four cooling fins 20A is connected to the first inlet 112A. The second inlets 22A are respectively connected to the first outlets 113A. Since each of the cooling fin chambers 21A of the cooling fins 20A has a tesla valve structure, and each of the chambers 111A of the main body 11A of the thermal board 10A has a tesla valve structure, by the multiple tesla valve structures, the working fluid is limited to flow in a single direction, and allows a larger amount of the working fluid to flow from the thermal board 10A towards each of the cooling fins 20A and back into the thermal board 10A, thereby dissipating more heat and having a better heat dissipating efficiency.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat dissipating device comprising:
   a thermal board having
      at least two chambers formed inside the thermal board;
         said at least two chambers each having
            a first inlet connected to an end of the respective chamber; and
            at least one first outlet connected to another end of the respective chamber through an outlet recess corresponding to each of the at least two chambers;
      a first evaporating section adjacent to the first inlet;
      a second evaporating section adjacent to the at least one first outlet;
      a passive one-way valve section located between the first evaporating section and the second evaporating section; the first evaporating section, the passive one-way valve section, and the second evaporating section being sequentially connected to each other;
   at least two cooling fins each having
      an inner space;
      at least one second inlet and a second outlet formed by the inner space; the at least one second inlet being connected to the at least one first outlet; the second outlet connected to the first inlet; and
   a working fluid filled in the at least two chambers and the inner spaces of the at least two colling fins; the passive one-way valve section configured to limit the working fluid to cycle in the at least two chambers of the thermal board and the inner spaces of the at least one-two cooling fins along a single direction,
   wherein the outlet recess fluidly connected to a first chamber of said at least two chambers and the outlet recess fluidly connected to a second chamber of said at least two chambers are fluidly separated from each other.

2. The heat dissipating device as claimed in claim 1, wherein the passive one-way valve section of each chamber is a tesla valve.

3. The heat dissipating device as claimed in claim 1, wherein the thermal board has
   a main body having
      a first side surface;
      a second side surface; each of the at least two chambers formed on the second side surface;
      at least two assembling grooves formed inward on the first side surface;
   each of the at least two assembling grooves elongated to match a shape of the first side surface;
      an inlet recess formed on the second side surface; the inlet recess connected to the at least two chambers and the first inlets; and
      the separated outlet recesses formed on the second side surface; and
   a cover assembled with the second side surface of the main body.

4. The heat dissipating device as claimed in claim 2, wherein the thermal board has
   a main body having
      a first side surface;
      a second side surface; each of the at least two chambers formed on the second side surface;
      at least two assembling grooves formed inward on the first side surface;
   each of the at least two assembling grooves elongated to match a shape of the first side surface;
      an inlet recess formed on the second side surface; the inlet recess connected to the at least two chambers and the first inlets; and
      the separated outlet recesses formed on the second side surface; and
   a cover assembled with the second side surface of the main body.

5. The heat dissipating device as claimed in claim 1, wherein
   the thermal board has
      a filling port connected to the at least two chambers; the heat dissipating device has
      a liquid filling unit including a liquid filling connector, a connecting pipe, and a fixing base; an end of the liquid filling unit connected to the at least two chambers.

6. The heat dissipating device as claimed in claim 4, wherein the thermal board has
   a filling port connected to the at least two chambers;
   the heat dissipating device has
   a liquid filling unit including a liquid filling connector, a connecting pipe, and a fixing base; an end of the liquid filling unit connected to the at least two chambers.

7. The heat dissipating device as claimed in claim 1, wherein
   the at least two chambers comprises four chambers;
   the at least two cooling fins comprises four cooling fins;
   each of the four cooling fins has an extending channel formed by the inner space of each cooling fin, and the at least one second inlet and the second outlet of each cooling fin are each formed on a respective one of two ends of the extending channel;
   the four cooling fins are mounted on a side surface of the thermal board;
   the four cooling fins respectively correspond to the four chambers; and
   each of the four chambers is connected to the extending channel of the corresponding cooling fin.

8. The heat dissipating device as claimed in claim 6, wherein
   the at least two chambers comprises four chambers;
   the at least two cooling fins comprises four cooling fins;
   each of the four cooling fins has an extending channel formed by the inner space of each cooling fin, and the at least one second inlet and the second outlet of each cooling fin are each formed on a respective one of two ends of the extending channel;
   the four cooling fins are mounted on the first side surface of the main body of the thermal board;
   the four cooling fins respectively correspond to the four chambers; and
   each of the four chambers is connected to the extending channel of the corresponding cooling fin.

9. The heat dissipating device as claimed in claim 1, wherein each of the at least two cooling fins has a cooling fin chamber formed by the inner space of the cooling fin, and the at least one second inlet and the second outlet of each cooling fin are each formed on a respective one of two ends of respective cooling fin chamber.

10. The heat dissipating device as claimed in claim 9, wherein
    the passive one-way valve section of the at least two chambers is a tesla valve; and
    the cooling fin chambers of the at least two cooling fins each have a tesla valve structure.

11. The heat dissipating device as claimed in claim 9, wherein the thermal board has
    a main body having
       a first side surface;
       a second side surface; each of the at least two chambers formed on the second side surface;
       at least two assembling grooves formed inward on the first side surface;
    each of the at least two assembling grooves elongated to match a shape of the first side surface;
       an inlet recess formed on the second side surface; the inlet recess connected to the at least two chambers and the first inlets; and
       the separated outlet recesses formed on the second side surface; and
    a cover assembled with the second side surface of the main body.

12. The heat dissipating device as claimed in claim 10, wherein the thermal board has
    a main body having
       a first side surface;
       a second side surface; each of the at least two chambers formed on the second side surface;
       at least two assembling grooves formed inward on the first side surface;
    each of the at least two assembling grooves elongated to match a shape of the first side surface;
       an inlet recess formed on the second side surface; the inlet recess connected to the at least two chambers and the first inlets; and
       the separated outlet recesses formed on the second side surface; and
    a cover assembled with the second side surface of the main body.

13. The heat dissipating device as claimed in claim 9, wherein the thermal board has
    a filling port connected to the at least two chambers; the heat dissipating device has a liquid filling unit including a liquid filling connector, a connecting pipe, and a fixing base; an end of the liquid filling unit connected to the at least two chambers.

14. The heat dissipating device as claimed in claim 12, wherein the thermal board has
a filling port connected to the at least two chambers; the heat dissipating device has
a liquid filling unit including a liquid filling connector, a connecting pipe, and a fixing base; an end of the liquid filling unit connected to the at least two chambers.

15. The heat dissipating device as claimed in claim 9, wherein
the at least two chambers comprises four chambers;
the at least two cooling fins comprises four cooling fins;
each of the four cooling fins has a cooling fin chamber formed by the inner space of each cooling fin, and the at least one second inlet and the second outlet of each cooling fin are each formed on a respective one of two ends of the cooling fin chamber;
the four cooling fins are mounted on a side surface of the thermal board;
the four cooling fins respectively correspond to the four chambers; and
each of the four chambers is connected to the cooling fin chamber of the corresponding cooling fin.

16. The heat dissipating device as claimed in claim 14, wherein
the at least two chambers comprises four chambers;
the at least two cooling fins comprises four cooling fins;
each of the four cooling fins has a cooling fin chamber formed by the inner space of each cooling fin, and the at least one second inlet and the second outlet of each cooling fin, and the at least one second inlet and the second outlet of each cooling fin are each formed on a respective one of two ends of the cooling fin chamber;
the four cooling fins are mounted on the first side surface of the main body of the thermal board;
the four cooling fins respectively correspond to the four chambers; and
each of the four chambers is connected to the cooling fin chamber of the corresponding cooling fin.

\* \* \* \* \*